(12) United States Patent  
Estakhri

(10) Patent No.: US 8,019,932 B2  
(45) Date of Patent: *Sep. 13, 2011

(54) BLOCK MANAGEMENT FOR MASS STORAGE

(75) Inventor: Petro Estakhri, Pleasanton, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/773,187

(22) Filed: May 4, 2010

(65) Prior Publication Data

US 2010/0217925 A1  Aug. 26, 2010

Related U.S. Application Data

(63) Continuation of application No. 11/652,727, filed on Jan. 11, 2007, now Pat. No. 7,734,862, which is a continuation of application No. 10/455,550, filed on Jun. 4, 2003, now Pat. No. 7,167,944, which is a continuation-in-part of application No. 09/620,544, filed on Jul. 21, 2000, now Pat. No. 6,978,342.

(51) Int. Cl.
*G06F 13/00* (2006.01)
*G06F 13/28* (2006.01)
*G06F 9/26* (2006.01)
*G06F 9/34* (2006.01)

(52) U.S. Cl. ........ 711/103; 711/154; 711/165; 711/203; 711/E12.008

(58) Field of Classification Search .................. None
See application file for complete search history.

(56) References Cited

U.S. PATENT DOCUMENTS

| 4,099,069 A | 7/1978 | Cricchi et al. |
| 4,130,900 A | 12/1978 | Watanabe |
| 4,210,959 A | 7/1980 | Wozniak |

(Continued)

FOREIGN PATENT DOCUMENTS

AU   0 557 723   1/1987

(Continued)

OTHER PUBLICATIONS

Mendel Rosenblum and John K. Ousterhout, The Design and Implementation of a Log-Structured File System, article, 1991, 15 pgs., Berkeley, USA.

(Continued)

*Primary Examiner* — Reginald G Bragdon
*Assistant Examiner* — Eric S Cardwell
(74) *Attorney, Agent, or Firm* — Leffert Jay & Poglaze, P.A.

(57) ABSTRACT

An embodiment of the present invention includes a nonvolatile memory system comprising nonvolatile memory for storing sector information, the nonvolatile memory being organized into blocks with each block including a plurality of sectors, each sector identified by a logical block address and for storing sector information. A controller is coupled to the nonvolatile memory for writing sector information to the latter and for updating the sector information, wherein upon updating sector information, the controller writes to the next free or available sector(s) of a block such that upon multiple re-writes or updating of sector information, a plurality of blocks are substantially filled with sector information and upon such time, the controller rearranges the updated sector information in sequential order based on their respective logical block addresses thereby increasing system performance and improving manufacturing costs of the controller.

16 Claims, 5 Drawing Sheets

U.S. PATENT DOCUMENTS

| | | | |
|---|---|---|---|
| 4,309,627 A | 1/1982 | Tabata |
| 4,355,376 A | 10/1982 | Gould |
| 4,398,248 A | 8/1983 | Hsia et al. |
| 4,405,952 A | 9/1983 | Slakmon |
| 4,414,627 A | 11/1983 | Nakamura |
| 4,450,559 A | 5/1984 | Bond et al. |
| 4,456,971 A | 6/1984 | Fukuda et al. |
| 4,468,730 A | 8/1984 | Dodd et al. |
| 4,473,878 A | 9/1984 | Zolnowsky et al. |
| 4,476,526 A | 10/1984 | Dodd |
| 4,498,146 A | 2/1985 | Martinez |
| 4,525,839 A | 6/1985 | Nozawa et al. |
| 4,532,590 A | 7/1985 | Wallach et al. |
| 4,609,833 A | 9/1986 | Guterman |
| 4,616,311 A | 10/1986 | Sato |
| 4,654,847 A | 3/1987 | Dutton |
| 4,710,871 A | 12/1987 | Belknap et al. |
| 4,746,998 A | 5/1988 | Robinson et al. |
| 4,748,320 A | 5/1988 | Yorimoto et al. |
| 4,757,474 A | 7/1988 | Fukushi et al. |
| 4,774,700 A | 9/1988 | Satoh et al. |
| 4,780,855 A | 10/1988 | Iida et al. |
| 4,788,665 A | 11/1988 | Fukuda et al. |
| 4,797,543 A | 1/1989 | Watanabe |
| 4,800,520 A | 1/1989 | Iijima |
| 4,829,169 A | 5/1989 | Watanabe |
| 4,843,224 A | 6/1989 | Ohta et al. |
| 4,896,262 A | 1/1990 | Wayama et al. |
| 4,914,529 A | 4/1990 | Bonke |
| 4,920,518 A | 4/1990 | Nakamura et al. |
| 4,924,331 A | 5/1990 | Robinson et al. |
| 4,943,745 A | 7/1990 | Watanabe et al. |
| 4,953,122 A | 8/1990 | Williams |
| 4,970,642 A | 11/1990 | Yamamura |
| 4,970,727 A | 11/1990 | Miyawaki et al. |
| 5,070,474 A | 12/1991 | Tuma et al. |
| 5,093,785 A | 3/1992 | Iijima |
| 5,168,465 A | 12/1992 | Harari |
| 5,198,380 A | 3/1993 | Harari |
| 5,200,959 A | 4/1993 | Gross et al. |
| 5,218,695 A | 6/1993 | Noveck et al. |
| 5,220,518 A | 6/1993 | Haq |
| 5,226,168 A | 7/1993 | Kobayashi et al. |
| 5,227,714 A | 7/1993 | Lou |
| 5,253,351 A | 10/1993 | Yamamoto et al. |
| 5,267,218 A | 11/1993 | Elbert |
| 5,268,318 A | 12/1993 | Harari |
| 5,268,870 A | 12/1993 | Harari |
| 5,270,979 A | 12/1993 | Harari et al. |
| 5,293,560 A | 3/1994 | Harari |
| 5,297,148 A | 3/1994 | Harari et al. |
| 5,303,198 A | 4/1994 | Adachi et al. |
| 5,305,276 A | 4/1994 | Uenoyama |
| 5,305,278 A | 4/1994 | Inoue |
| 5,315,541 A | 5/1994 | Harari et al. |
| 5,315,558 A | 5/1994 | Hag |
| 5,329,491 A | 7/1994 | Brown et al. |
| 5,337,275 A | 8/1994 | Garner |
| 5,341,330 A | 8/1994 | Wells et al. |
| 5,341,339 A | 8/1994 | Wells |
| 5,341,341 A | 8/1994 | Fukuzo |
| 5,353,256 A | 10/1994 | Fandrich et al. |
| 5,357,475 A | 10/1994 | Hasbun et al. |
| 5,359,569 A | 10/1994 | Fujita et al. |
| 5,365,127 A | 11/1994 | Manley |
| 5,369,615 A | 11/1994 | Harari et al. |
| 5,371,702 A | 12/1994 | Nakai et al. |
| 5,381,539 A | 1/1995 | Yanai et al. |
| 5,382,839 A | 1/1995 | Shinohara |
| 5,384,743 A | 1/1995 | Rouy |
| 5,388,083 A | 2/1995 | Assar et al. |
| 5,396,468 A | 3/1995 | Harari et al. |
| 5,404,485 A | 4/1995 | Ban |
| 5,406,527 A | 4/1995 | Honma |
| 5,418,752 A | 5/1995 | Harari et al. |
| 5,422,842 A | 6/1995 | Cernea et al. |
| 5,422,856 A | 6/1995 | Sasaki et al. |
| 5,428,621 A | 6/1995 | Mehrotra et al. |
| 5,430,682 A | 7/1995 | Ishikawa et al. |
| 5,430,859 A | 7/1995 | Norman et al. |
| 5,431,330 A | 7/1995 | Wieres |
| 5,434,825 A | 7/1995 | Harari |
| 5,438,573 A | 8/1995 | Mangan et al. |
| 5,465,235 A | 11/1995 | Miyamoto |
| 5,465,338 A | 11/1995 | Clay |
| 5,471,478 A | 11/1995 | Mangan et al. |
| 5,473,765 A | 12/1995 | Gibbons et al. |
| 5,479,638 A | 12/1995 | Assar et al. |
| 5,485,595 A | 1/1996 | Assar et al. |
| 5,490,117 A | 2/1996 | Oda et al. |
| 5,495,442 A | 2/1996 | Cernea et al. |
| 5,504,760 A | 4/1996 | Harari et al. |
| 5,508,971 A | 4/1996 | Cernea et al. |
| 5,513,138 A | 4/1996 | Manabe et al. |
| 5,515,333 A | 5/1996 | Fujita et al. |
| 5,519,847 A | 5/1996 | Fandrich et al. |
| 5,523,980 A | 6/1996 | Sakui et al. |
| 5,524,230 A | 6/1996 | Sakaue et al. |
| 5,530,673 A | 6/1996 | Tobita et al. |
| 5,530,828 A | 6/1996 | Kaki et al. |
| 5,530,938 A | 6/1996 | Akasaka et al. |
| 5,532,962 A | 7/1996 | Auclair et al. |
| 5,532,964 A | 7/1996 | Cernea et al. |
| 5,534,456 A | 7/1996 | Yuan et al. |
| 5,535,328 A | 7/1996 | Harari et al. |
| 5,541,551 A | 7/1996 | Brehner et al. |
| 5,544,118 A | 8/1996 | Harari |
| 5,544,356 A | 8/1996 | Robinson et al. |
| 5,552,698 A | 9/1996 | Tai et al. |
| 5,554,553 A | 9/1996 | Harari |
| 5,563,825 A | 10/1996 | Cernea et al. |
| 5,566,314 A | 10/1996 | DeMarco et al. |
| 5,568,439 A | 10/1996 | Harari |
| 5,572,466 A | 11/1996 | Sukegawa |
| 5,579,502 A | 11/1996 | Konishi et al. |
| 5,581,723 A | 12/1996 | Hasbun et al. |
| 5,583,812 A | 12/1996 | Harari |
| 5,592,415 A | 1/1997 | Kato et al. |
| 5,592,420 A | 1/1997 | Cernea et al. |
| 5,596,526 A | 1/1997 | Assar et al. |
| 5,598,370 A | 1/1997 | Niijima et al. |
| 5,602,987 A | 2/1997 | Harari et al. |
| 5,603,001 A | 2/1997 | Sukegawa et al. |
| 5,606,660 A | 2/1997 | Estakhri et al. |
| 5,611,067 A | 3/1997 | Okamoto et al. |
| 5,640,528 A | 6/1997 | Harney et al. |
| 5,642,312 A | 6/1997 | Harari |
| 5,648,929 A | 7/1997 | Miyamoto |
| 5,663,901 A | 9/1997 | Wallace et al. |
| 5,693,570 A | 12/1997 | Cernea et al. |
| 5,712,819 A | 1/1998 | Harari |
| 5,719,808 A | 2/1998 | Harari et al. |
| 5,723,990 A | 3/1998 | Roohparvar |
| 5,734,567 A | 3/1998 | Griffiths et al. |
| 5,745,418 A | 4/1998 | Ma et al. |
| 5,754,567 A | 5/1998 | Norman |
| 5,757,712 A | 5/1998 | Nagel et al. |
| 5,758,100 A | 5/1998 | Odisho |
| 5,761,117 A | 6/1998 | Uchino et al. |
| 5,768,190 A | 6/1998 | Tanaka et al. |
| 5,768,195 A | 6/1998 | Nakamura et al. |
| 5,773,901 A | 6/1998 | Kantner |
| 5,778,418 A | 7/1998 | Auclair et al. |
| 5,781,478 A | 7/1998 | Takeuchi et al. |
| 5,787,445 A | 7/1998 | Daberko |
| 5,787,484 A | 7/1998 | Norman |
| RE35,881 E | 8/1998 | Barrett et al. |
| 5,799,168 A | 8/1998 | Ban |
| 5,802,551 A | 9/1998 | Komatsu et al. |
| 5,809,515 A | 9/1998 | Kaki et al. |
| 5,809,558 A | 9/1998 | Matthews et al. |
| 5,809,560 A | 9/1998 | Schneider |
| 5,818,350 A | 10/1998 | Estakhri et al. |
| 5,818,781 A | 10/1998 | Estakhri et al. |
| 5,822,245 A | 10/1998 | Gupta et al. |
| 5,822,252 A | 10/1998 | Lee et al. |
| 5,822,781 A | 10/1998 | Wells et al. |

| | | |
|---|---|---|
| 5,831,929 A | 11/1998 | Manning |
| 5,835,935 A | 11/1998 | Estakhri et al. |
| 5,838,614 A | 11/1998 | Estakhri et al. |
| 5,845,313 A | 12/1998 | Estakhri et al. |
| 5,847,552 A | 12/1998 | Brown |
| 5,860,083 A | 1/1999 | Sukegawa |
| 5,860,124 A | 1/1999 | Matthews et al. |
| 5,862,099 A | 1/1999 | Gannage et al. |
| 5,890,192 A | 3/1999 | Lee et al. |
| 5,901,086 A | 5/1999 | Wang et al. |
| 5,907,856 A | 5/1999 | Estakhri et al. |
| 5,909,586 A | 6/1999 | Anderson |
| 5,920,884 A | 7/1999 | Jennings, III et al. |
| 5,924,113 A | 7/1999 | Estakhri et al. |
| 5,928,370 A | 7/1999 | Asnaashari |
| 5,930,815 A | 7/1999 | Estakhri et al. |
| 5,933,368 A | 8/1999 | Ma et al. |
| 5,933,846 A | 8/1999 | Endo |
| 5,936,971 A | 8/1999 | Harari et al. |
| 5,937,425 A | 8/1999 | Ban |
| 5,953,737 A | 9/1999 | Estakhri et al. |
| 5,956,473 A | 9/1999 | Ma et al. |
| 5,959,926 A | 9/1999 | Jones et al. |
| 5,966,727 A | 10/1999 | Nishino |
| 5,986,933 A | 11/1999 | Takeuchi et al. |
| 5,987,563 A | 11/1999 | Itoh et al. |
| 5,987,573 A | 11/1999 | Hiraka |
| 5,991,849 A | 11/1999 | Yamada et al. |
| 6,011,322 A | 1/2000 | Stumfall et al. |
| 6,011,323 A | 1/2000 | Camp |
| 6,018,265 A | 1/2000 | Keshtbod |
| 6,021,408 A | 2/2000 | Ledain et al. |
| 6,026,020 A | 2/2000 | Matsubara et al. |
| 6,026,027 A | 2/2000 | Terrell, II et al. |
| 6,034,897 A | 3/2000 | Estakhri et al. |
| 6,035,357 A | 3/2000 | Sakaki |
| 6,040,997 A | 3/2000 | Estakhri |
| 6,041,001 A | 3/2000 | Estakhri |
| 6,047,352 A | 4/2000 | Lakhani et al. |
| 6,055,184 A | 4/2000 | Acharya et al. |
| 6,055,188 A | 4/2000 | Takeuchi et al. |
| 6,069,827 A | 5/2000 | Sinclair |
| 6,072,796 A | 6/2000 | Christensen et al. |
| 6,076,137 A | 6/2000 | Asnaashari |
| 6,081,447 A | 6/2000 | Lofgren et al. |
| 6,081,878 A | 6/2000 | Estakhri et al. |
| 6,084,483 A | 7/2000 | Keshtbod |
| 6,097,666 A | 8/2000 | Sakui et al. |
| 6,115,785 A | 9/2000 | Estakhri et al. |
| 6,122,195 A | 9/2000 | Estakhri et al. |
| 6,125,424 A * | 9/2000 | Komatsu et al. .............. 711/103 |
| 6,125,435 A | 9/2000 | Estakhri et al. |
| 6,128,695 A | 10/2000 | Estakhri et al. |
| 6,134,145 A | 10/2000 | Wong |
| 6,134,151 A | 10/2000 | Estakhri et al. |
| 6,141,249 A | 10/2000 | Estakhri et al. |
| 6,145,051 A | 11/2000 | Estakhri et al. |
| 6,151,247 A | 11/2000 | Estakhri et al. |
| 6,172,906 B1 | 1/2001 | Estakhri et al. |
| 6,173,362 B1 | 1/2001 | Yoda |
| 6,181,118 B1 | 1/2001 | Meehan et al. |
| 6,182,162 B1 | 1/2001 | Estakhri et al. |
| 6,202,138 B1 | 3/2001 | Estakhri et al. |
| 6,223,308 B1 | 4/2001 | Estakhri et al. |
| 6,226,708 B1 | 5/2001 | McGoldrick et al. |
| 6,230,234 B1 | 5/2001 | Estakhri et al. |
| 6,262,918 B1 | 7/2001 | Estakhri et al. |
| 6,272,610 B1 | 8/2001 | Katayama et al. |
| 6,275,436 B1 | 8/2001 | Tobita et al. |
| 6,279,069 B1 | 8/2001 | Robinson et al. |
| 6,279,114 B1 | 8/2001 | Toombs et al. |
| 6,285,607 B1 | 9/2001 | Sinclair |
| 6,327,639 B1 | 12/2001 | Asnaashari |
| 6,345,367 B1 | 2/2002 | Sinclair |
| 6,374,337 B1 | 4/2002 | Estakhri |
| 6,385,667 B1 | 5/2002 | Estakhri et al. |
| 6,393,513 B2 | 5/2002 | Estakhri et al. |
| 6,397,314 B1 | 5/2002 | Estakhri et al. |
| 6,411,546 B1 | 6/2002 | Estakhri et al. |
| 6,467,021 B1 | 10/2002 | Sinclair |
| 6,490,649 B2 | 12/2002 | Sinclair |
| 6,567,307 B1 | 5/2003 | Estakhri |
| 6,578,127 B1 | 6/2003 | Sinclair |
| 6,587,382 B1 | 7/2003 | Estakhri et al. |
| 6,711,059 B2 | 3/2004 | Sinclair et al. |
| 6,721,819 B2 | 4/2004 | Estakhri et al. |
| 6,721,843 B1 | 4/2004 | Estakhri |
| 6,725,321 B1 | 4/2004 | Sinclair et al. |
| 6,728,851 B1 | 4/2004 | Estakhri et al. |
| 6,751,155 B2 | 6/2004 | Gorobets |
| 6,757,800 B1 | 6/2004 | Estakhri et al. |
| 6,772,274 B1 | 8/2004 | Estakhri |
| 6,813,678 B1 | 11/2004 | Sinclair et al. |
| 6,898,662 B2 | 5/2005 | Gorobets |
| 6,912,618 B2 | 6/2005 | Estakhri et al. |
| 6,950,918 B1 | 9/2005 | Estakhri |
| 6,957,295 B1 | 10/2005 | Estakhri |
| 6,973,519 B1 | 12/2005 | Estakhri et al. |
| 6,978,342 B1 | 12/2005 | Estakhri et al. |
| 7,000,064 B2 | 2/2006 | Payne et al. |
| 2003/0033471 A1 | 2/2003 | Lin et al. |

FOREIGN PATENT DOCUMENTS

| | | |
|---|---|---|
| EP | 0 220 718 | 5/1987 |
| EP | 0 243 503 | 11/1987 |
| EP | 0 392 895 | 10/1990 |
| EP | 0 424 191 | 4/1991 |
| EP | 0 489 204 | 6/1992 |
| EP | 0 522 780 | 1/1993 |
| EP | 0 544 252 | 6/1993 |
| EP | 0 613 151 | 8/1994 |
| EP | 0 617 363 | 9/1994 |
| EP | 0 619 541 | 10/1994 |
| EP | 0 663 636 | 7/1995 |
| EP | 0 686 976 | 12/1995 |
| EP | 0 691 008 | 1/1996 |
| EP | 0 722 585 | 7/1996 |
| EP | 0 852 765 | 7/1998 |
| EP | 0 852 766 | 7/1998 |
| EP | 0 861 468 | 9/1998 |
| EP | 0 891 580 | 1/1999 |
| EP | 0 896 699 | 2/1999 |
| EP | 0 897 579 | 2/1999 |
| EP | 0 910 826 | 4/1999 |
| EP | 0 978 040 | 2/2000 |
| EP | 1 157 328 | 11/2001 |
| FR | 93 01908 | 8/1993 |
| GB | 2 251 323 | 7/1992 |
| GB | 2 291 990 | 2/1996 |
| GB | 2 291 991 | 2/1996 |
| GB | 2 297 637 | 8/1996 |
| GB | 2 304 428 | 3/1997 |
| GB | 2 348 991 | 10/2000 |
| GB | 2 351 822 | 1/2001 |
| GB | 2 384 072 | 7/2003 |
| GB | 2 384 337 | 7/2003 |
| GB | 2 384 338 | 7/2003 |
| GB | 2 384 883 | 8/2003 |
| GB | 2 411 499 | 8/2005 |
| IS | 117881 | 5/2003 |
| JP | 58-215794 | 12/1983 |
| JP | 58-215795 | 12/1983 |
| JP | 59-045695 | 3/1984 |
| JP | 59-162695 | 9/1984 |
| JP | 60-212900 | 10/1985 |
| JP | 61-096598 | 5/1986 |
| JP | 62-283496 | 12/1987 |
| JP | 62-283497 | 12/1987 |
| JP | 63-183700 | 7/1988 |
| JP | 1-138694 | 5/1989 |
| JP | 3-228377 | 9/1991 |
| JP | 4-057295 | 2/1992 |
| JP | 4-254994 | 9/1992 |
| JP | 4-268284 | 9/1992 |
| JP | 4-278297 | 10/1992 |
| JP | 4-332999 | 11/1992 |
| JP | 5-128877 | 5/1993 |
| JP | 5-282883 | 10/1993 |

| | | |
|---|---|---|
| JP | 6-036578 | 2/1994 |
| JP | 6-124175 | 5/1994 |
| JP | 6-124231 | 5/1994 |
| JP | 6-131889 | 5/1994 |
| JP | 6-132747 | 5/1994 |
| JP | 6-149395 | 5/1994 |
| JP | 6-266596 | 9/1994 |
| JP | 7-093499 | 4/1995 |
| JP | 7-311708 | 11/1995 |
| JP | 8-018018 | 1/1996 |
| JP | 8-069696 | 3/1996 |
| JP | 9-147581 | 6/1997 |
| SU | 1388877 | 4/1988 |
| SU | 1408439 | 7/1988 |
| SU | 1515164 | 10/1989 |
| SU | 1541619 | 2/1990 |
| SU | 1573458 | 6/1990 |
| SU | 1686449 | 10/1991 |
| WO | WO 84/00628 | 2/1984 |
| WO | WO 94/20906 | 9/1994 |

OTHER PUBLICATIONS

Brian Dipert and Markus Levy, Designing with Flash Memory, book, Apr. 1994, 445 pgs., Annabooks, San Diego, USA.

Science Forum, Inc., Flash Memory Symposium '95, symposium,1995, 13 pgs.; Hongo, Bunkyo-ku, Tokyo.

Ross S. Finlayson and David R. Cheriton, An Extended File Service Exploiting Write-Once Storage, article, 1987, 10 pgs. ACM.

Jason Gait, The Optical File Cabinet: A Random-Access File System for Write-Once Optical Disks, article, Jun. 1988, 12 pgs., Beaverton, Oregon.

Henry G. Baker, Memory Management, book, 1995, 19 pgs., Springer-Verlag Berlin Heidelberg, Germany.

Sape J. Mullender and Andrew S. Tanenbaum, A Distributed File Service Based on Optimistic Concurrency Control, article, 1985, 12 pgs., ACM.

Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers, 2 pgs.

Hiroshi Nakamura, Junichi Miyamoto, Kenichi Imamiya, Yoshihisa Iwata, Yoshihisa Sugiura and Hideko Oodaira, A Novel Sensing Scheme with On-Chip Page Copy for Flexible Voltage NAND Flash Memories, article, Jun. 1996, 9 pgs., vol. E79-C. No. 6.

Takaaki Nozaki, Toshiaki Tanaka, Yoshiro Kijiya, Eita Kinoshita, Tatsuo Tsuchiya and Yutaka Hayashi, A 1-Mb EEPROM with MONOS Memory Cell for Semiconductor Disk Application, article, 1991, 5 pgs., Journal of Solid-State Circuits, vol. 26, No. 4.

Kai Hwang and Faye A. Briggs, Computer Architecture and Parallel Processing, book, 1984, McGraw-Hill, Inc. 2 pgs., US.

Walter Lahti and Dean McCarron, State of the Art: Magnetic VS. Optical Store Data in a Flash, article, 1990, 7 pgs., vol. 15, No. 12, McGraw-Hill. Inc., US.

Ron Wilson, Integrated Circuits; 1-Mbit flash memories seek their role in system design, article, Mar. 1, 1989, 2 pgs., No. 6, Tulsa, OK.

S. Mehroura, J.H. Yuan, R.A. Cemea, W.Y. Chien, D.C. Guteman, G. Samachisa, R.D. Noman, M. Mofidi, W. Lee, Y. Fong, A. Mihnea, E. Hann, R.W. Gregor, E.P. Eberhardt, J.R. Radosevich, K.R. Stiles, R.A. Kohler, C.W. Leung, and T.J. Mulrooney, Serial 9Mb F EEPROM for Solid State Disk Applications, symposium. 1992, 2 pgs., Mountain View, CA.

Steven H. Leibson, Nonvolatile, in-circuit-reprogrammable memories, article, Jan. 3, 1991, 12 pgs., EDN, Circle No. 12.

Ramon Caceres, Fred Douglis, Kai Li and Brian Marsh, Operating System Implications of Solid-State Mobile Computers, article, 7 pgs., Oct. 1993, Workshop on Workstation Operating Systems.

Michael Wu and Wily Zwaenepoel, A Non-Volatile, Main Memory Storage System, 12 pgs., 1994, ACM, San Jose, CA USA.

Dave Bursky, Innovative flash memories match DRAM densities: available with a choice of features, flash memories are finding homes in many systems (includes related articles on the origins of flash, and on the differences between NAND and NOR flash memories), article, May 16, 1994, 9 pgs., Electronic Design, v. 42, n. 10, The Gale Group.

Anthony Cataldo, New flash enhancements up ante. (Intel's 28F400BV-120 and 28F004BV-120, Atmel's AT29BV010 and AT29BV020, and Samsung Semiconductor's KM29V32000 *flash* memory* devices)(Product Announcement), article, Mar. 13, 1995, 4 pgs., Electronic News, v. 41, n. 2056, The Gale Group.

Sam Weber, *Flash* modules' portability, reusability, small size valued for a host of APPs-Consumer formats flocking to *flash*, article. Jul. 22, 1996, 9 pgs., Electronic Engineering Times, n. 911, CMP Media.

Toshiba, MOS Memory (Non-Volatile), 1995, Data Book.

Stan Baker, But Integration Calls for Hardware, Software Changes: Flash: designers face the dawn of a new memory age, article, Sep. 12, 2003, 5 pgs., Electronic Engineering Times, 1990, N. 619, 41, CMP Media.

Toshiba, Toshiba MOS Digital Integrated Circuit Silicon Gate CMOS, (TC58NS512DC) Mar. 21, 2001, 43 pgs., Data Book.

Toshiba Corporation, SMIL (Smartmedia Interface Library) Hardware Edition Version 1.00. Jul. 1, 2000, 36 pgs., Data Book.

Toshiba, Toshiba MOS Digital Integrated Circuit Silicon Gate. (TC58512FT), Mar. 5, 2001, 43 pgs., Data Book.

Toshiba, Toshiba MOS Digital Integrated Circuit Silicon Gate. (TC58DVM92A1FT00). Jan. 10, 2003, 44 pgs., Data Book.

35NONVOLATILE Memory Technology Review, A Time of Change, Proceedings 1993 Conference, Jun. 22-24, 1993, Linthlcum Heights, MD USA.

Toshiba Corporation, SMIL (Smartmedia Interface Library) Software Edition Version 1.00, Jul. 1, 2000, 136 pgs., Data Book.

Toshiba. MOS Memory (Non-Volatile), 1996, 279 pgs., Data Book.

Dan Auclair, Optimal Solid State Disk Architecture for Portable Computers, symposium, Jul. 9, 1991, 7 pgs., SunDisk Corporation. 1992 Symposium of VLSI Circuits Digest of Technical Papers, "EEPROM for Solid State Disk Applications", S. Mehoura et al., SunDisk Corporation, Sank Clara, CA. R.W. Grepor et al., AT&T Bell Laboratories, Allentown, PA. pp. 24 and 25.

* cited by examiner

BLOCK MANAGEMENT FOR MASS STORAGE

RELATED APPLICATIONS

This application is a continuation of U.S. patent application Ser. No. 11/652,727, filed on Jan. 11, 2007, now U.S. Pat. No. 7,734,862 issued on Jun. 8, 2010, titled "Block Management For Mass Storage" which is a continuation of U.S. patent application Ser. No. 10/455,550, filed on Jun. 4, 2003, now U.S. Pat. No. 7,167,944 issued on Jan. 23, 2007, titled "Block Management For Mass Storage", which is a continuation-in part of U.S. patent application Ser. No. 09/620,544, filed on Jul. 21, 2000, now U.S. Pat. No. 6,978,342 issued on Dec. 20, 2005 titled "Moving Sectors Within a Block of Information In a Flash Memory Mass Storage Architecture", the disclosures of which are incorporated herein by reference as though set forth in full.

BACKGROUND OF THE INVENTION

1. Technical Field

The present invention relates generally to methods and apparatus for improving the performance of file management within nonvolatile memory devices and particularly to increasing the speed of writing or storing information to such nonvolatile memory devices.

2. Description of Prior Art

Various prior art methods and techniques were used to manage files, i.e. store data and read back data, within non-volatile memory devices. Generally, a host device commands a controller, coupled between the host device and nonvolatile memory, to store certain information within nonvolatile memory and later to read the same. Such information depends on the application of the nonvolatile memory device. For example, in the case of digital cameras, digital pictures or photos is the information stored and retrieve from nonvolatile memory. In the case of Personal Computers (PCs), information is stored and retrieved from hard disk.

Since information is typically organized in sectors, each sector including a predetermined number of user data and a predetermined number of overhead data, the host commands the controller to store sector information by referencing addresses associated with particular sectors. For example, there may be sectors 0 through N and each a group of sectors may define a block which would also have an address associated therewith for identifying the same. The controller uses sector addresses to organize digital information within the nonvolatile memory device.

In one prior art technique, as a part of file management of nonvolatile memory, when the host device commands the controller to write or store information to one or more particular sectors, identified by logical block addresses (LBAs), the controller writes to physical block addresses (PBAs) in the nonvolatile memory. Each block includes a very large amount of nonvolatile memory space, for example, 64 Kbytes. When a particular sector is updated or rewritten thereto in nonvolatile memory, the controller writes the updated sector information to another location within the 64 Kbyte block space. To keep track of the current sector information, flags and address information are utilized and are updated by the controller to reflect the status of the sector. U.S. Pat. No. 5,341,330, issued on Aug. 23, 1994 to Wells et al. and entitled "Method For Writing to a Flash Memory Array During Erase Suspend Intervals" is an example of the teachings of such prior art technique. In the case where a particular sector is updated within a block, the sector location including previous information is marked 'old' utilizing a flag and the new or current sector location is marked 'new'. Finally, when the block is full, i.e. no free or available location remains, a new block is used to store further updates to sectors and the old block is eventually erased prior to being re-utilized.

An example of the above discussion is perhaps better shown by reference to the example of FIG. 1 depicting a block 10 and a block 12, each of which include 64 Kbytes of storage area organized into sector locations for storing sector information. The number of sector locations included within a block is a function of the size of each sector. In the case, for example, where each sector includes 512 bytes, the number of sectors included within a block having 64 Kbytes is obviously 64×1024 divided by 512 or 128.

Referring still to FIG. 1, when the host writes to a sector location identified by LBA 0, the controller stores said information into 14 and associated flag(s) are set to 'new' the first time such a write or store operation takes place after erasure of the block 10. However, after following writes to the same sector, eventually, sector 0 at 14 will be set to 'old' indicating that the information stored therein is no longer current and that the controller should read another location to obtain the latest sector 0 information. This occurs when sector 0 is re-written or updated a following time and because information at 14 cannot be re-written without the block 10 first being erased. Since no erasure of block 10 has taken place, the next time sector 0 is written, its information will be placed at 28 and while the flag for location 14 will be set to 'old', the flag for location 28 is set to 'new' indicative of the most up-to-date sector 0 information until the latter is again updated, at which time the current information is stored for location 44 in block 10 and the flag at 44 is set to 'new' while the flag for location 28 is set to 'old'.

The scenario described above applies to the writing or updating of all other sectors. By brief way of example, sector information identified by LBA 1, is initially written at 16 and the next time it is written, it is written to the next available location in Block 10 which is location 30 and the following time after that when it is written by the host, it is written at 36 and the flags of 16, 30 and 36 are updated as describe above. This process continues until the block 10 becomes full at which time a new, or available, or free block is found by the controller, in this case, block 12. From thereon, updated sector information is written to the block 12, not only this, but at some point, if necessary, all sector locations including current sector information are moved to the block 12, as explained in U.S. Pat. No. 5,341,330.

For example, in FIG. 1, after the first time when the sector identified by LBA 50 is written, assuming the host commands the controller to write to LBA 50 a next time and the block 10 is found to be full, the re-writing of sector 50 takes place within the block 12 rather than the block 10. In fact, the re-written sector 50 information is written at 50 and all other sectors designated as having current or 'new' sector information are moved to the block 12. This includes the sector identified by LBA 901, which is at 24 in block 10 and moved to 52 in block 12, the sector identified by LBA 902, which is at 26 in block 10 and moved to 54 in block 12, the sector identified by LBA 900, which is at 34 in block 10 and moved to 56 in block 12 (note that this sector was initially written at 22 but the sector information at 22 is now 'old' and the most recent information resides at 34, which is the reason for moving the information stored at 34 rather than the information at 22), the sector identified by LBA 1, which is at 36 in block 10 and moved to 58 in block 12 and so on.

The above prior art technique is described in further detail in U.S. patent application having Ser. No. 09/620,544 filed on Jul. 21, 2000 and entitled "Moving Sectors Within a Block of Information In a Flash Memory Mass Storage Architure", the disclosure of which is incorporated herein by reference as though set forth in full. The problem with this technique is that to move all of the sectors including current information to another new block is time consuming and therefore a performance hindrance. This problem is even further exaggerated when using smaller block sizes as there are more numerous move operations with smaller block sizes and smaller block sizes are more prevalent by today's users of nonvolatile memory devices, particularly by users of nonvolatile memory devices.

In the patent document referred to hereinabove, a method and apparatus is introduced for improving the performance of managing files or data within nonvolatile memory by organizing the memory into smaller block sizes and introducing a virtual logical block address (VLBA) to PBA relationship and a unique VLBA was assigned to each block and within each VLBA were sectors arranged in sequential order for decreasing the number of moves to expedite or improve the performance of the system through the use of mapping of PBAs to VLBAs. This VLBA to PBA mapping caused the size of the space manager within the controller device to decrease thereby resulting in a less expensive manufacturing of the controller device. However, in this method, it is presumed that sectors are written in sequential order by the host, if this is not the case, there is much wasted memory space.

In further explanation of prior art techniques, FIG. 1(a) shows another method for updating sector information in that when sector information is re-written by a host, the new or updated information need be written to a free block. For example, as shown in FIG. 1(a), when sector information, identified by LBA 0 in Block 0, is re-written or updated, the updated LBA 0 sector information is written to LBA 0 of Block 1. All other sectors within the Block 0 need then be moved to Block 1. Accordingly, every time there is a re-write or update of a sector, an entire block of information is moved to a new or free block. Obviously, this adversely affects system performance because every time there is a re-write of a sector, a new location within a free block is written thereto while the old information remains in the previous block until the system erases the latter.

In yet another prior art technique, sectors are not moved necessarily right away after every sector information update, rather, re-writes and move operations are kept track thereof and when a block is full or nearly full of mostly old sector information, its current sector information is then moved to a new block. For example, as shown in FIG. 1(b), when sector information to LBA 0 is updated, it is written to an available sector location in an available or free block but the remaining sectors of the previous block are not moved to the new block. Thus the previous block continues to hold some current sector information as well as some old sector information. The system keeps track of rewrites so that it has knowledge of which sectors are old and which are current and when a block is full or nearly full of old sector information, it moves the current sector information, if any, to the new of available block.

Thus, the need arises for a system and method for file or data management of information that is organized into sectors within nonvolatile memory devices while improving the performance for doing the same in an inexpensive manner.

DETAILED DESCRIPTION

Figure 2:
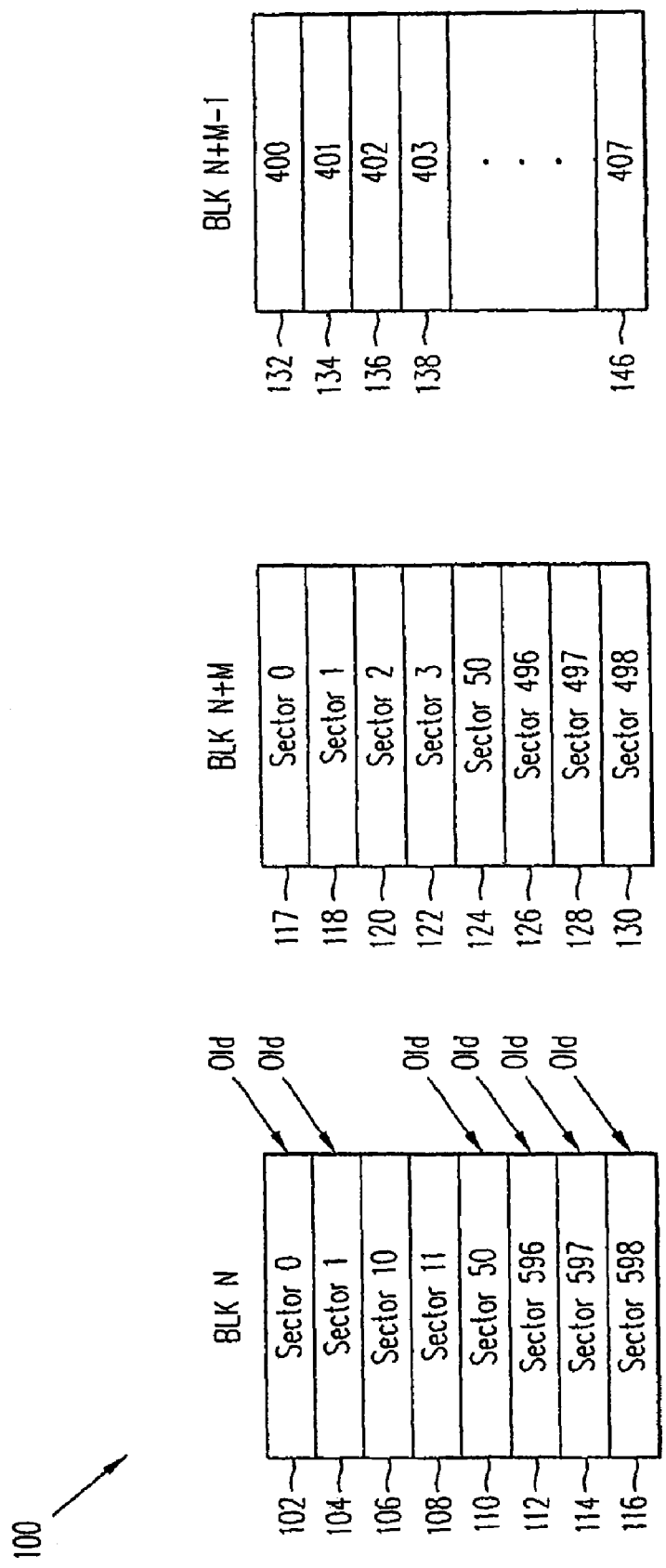
FIG. 2 shows an example of the organization of information within nonvolatile memory devices is shown, in accordance with an embodiment of the present invention.

Referring now to FIG. 2, an example of the organization of information within nonvolatile memory devices is shown, in accordance with an embodiment of the present invention, to include M number of blocks 100, M being an integer with each block including sector information. As will be apparent shortly, the blocks 100 are temporary locations for storage of sector information commanded to be written by the host through a controller device. The blocks 100 are shown to include Block N, Block N+M and Block N+M−1, wherein N is also an integer number. The reason for the notation N is to emphasize that Block N and in fact Blocks N+M and N+M−1 can be any one of the blocks within a nonvolatile memory. In one embodiment of the present invention, four blocks are designated as the blocks within 100 and thus temporary locations for storing data or information received from the host but in other embodiments of the present invention, any number of blocks may be employed.

In one embodiment of the present invention, each block includes 8 sectors but again, any number of sectors may be assigned to a block without departing from the scope and spirit of the present invention. Thus, in FIG. 2, Block N includes eight sector locations, as does Block N+M and Block N+M−1. In the example of FIG. 2, when the host initially writes a sector identified by the LBA 0, this information is placed in the first sector location of Block N, at 102. Next, if the host writes information to a sector identified by LBA 1, this information is placed at the next available location within Block N at 104 and assuming the host next writes to a sector identified by the LBA 10, the same is stored at 106, followed by a host write to a sector identified by LBA 11, which is written at 108, LBA 50, which is written at 110, LBA 496, written at 112 and LBA 497 at 114 and 498 at 116. These are all shown to have been written to Block N.

In this example, the next time the host rewrites to or updates the sector identified by LBA 0, this information is stored in Block N+M, at its first sector location, 116 and at such time, the information at 102 in Block N is designated as being 'old' through the use of a flag or other means while the sector information at 117 is designated as 'new'. The same events occur when the scenario repeats itself for the updating of sector 1 where the location at 104 in Block N is designated as being 'old' and the location at 118 in Block N+M is designated as 'new' through the use of their respective flags.

The following sectors to be written, namely the sectors identified by LBAs 2, 3, 50, 496, 497 and 498, are also stored in Block N+M at 120-130, respectively. As shown, the sector identified by LBA 50 was previously written by the host and stored at 110 in Block N so that when it is updated, the new sector information is stored at 124 in Block N+M and the flag at 110 is modified to indicate 'old' whereas the flag at 124 is modified to indicate 'new'.

In the example of FIG. 2, the following sector writes are of sectors of sequential LBA order. This sector information are stored in block N+M−1 at 132-146, respectively. That is, the sector identified by LBA 400 is stored at 132, the next sector, identified by LBA 402 is stored at 134 and so on until the eight sequential sectors are stored within the Block N+M−1.

At a time when all of the blocks 100 are filled with sector information or at the right time, the controller performs a 'clean-up' operation, arranging the sectors in sequential order within blocks other than those included with the blocks 100 thus enabling the space manager within the controller device to avoid maintaining track of information stored within non-volatile memory on a sector-by-sector basis thereby improving manufacturing costs associated with the controller device by the latter having a smaller space manager requirement. Additionally, as will be evident, the number of move operations of sectors is reduced thereby increasing system performance.

Figure 3:
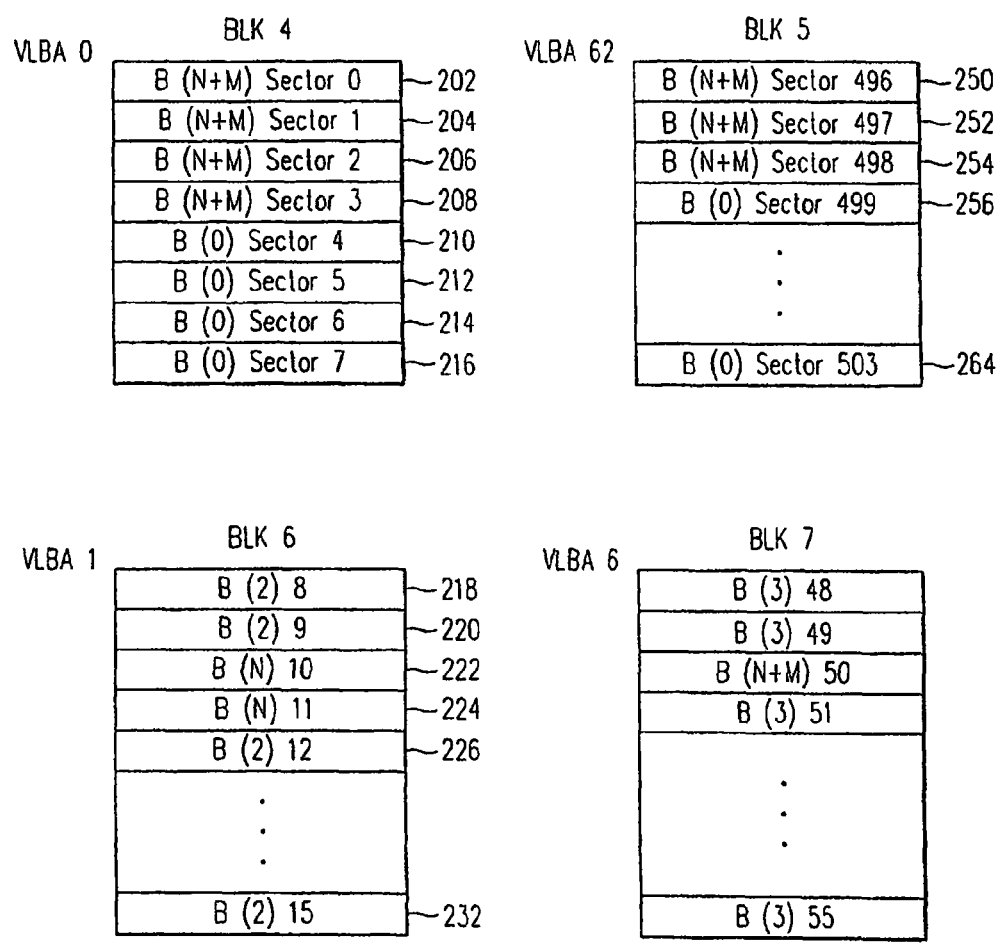
FIG. 3 illustrates the notion of finding free blocks by the controller and using the same for re-arranging sector information in accordance with a method of the present invention.

Referring now to FIG. 3, free blocks are found by the controller and used for re-arranging sector information. In this example, as noted above, four blocks are employed while other number of blocks may be used without departing from the spirit and scope of the present invention.

In FIG. 3, blocks 200 are shown to include four blocks, namely Block 4, Block 5, Block 6 and Block 7. Again, these blocks need not be Blocks 4-7 and can be any free blocks found by the controller. Each VLBA identifies a unique block having eight sectors. For example, VLBA 0 identifies Block 4, VLBA 1 identified Block 6, VLBA 62 identifies Block 5 and VLBA 6 identified Block 7. It is important to note that the numbering of the VLBAs is a function of the sequential order of the LBAs associated with sectors. That is, sectors identified by LBA 0-7 will be located in VLBA 0 and the next eight sectors, LBA 8-15 will be in VLBA 1 and the next eight (not shown in FIG. 3) will be in VLBA 2 and sectors identified by LBAs 496, 497, 498 through 503 are at VLBA 62 because 496 divided by 8 is 62, and sectors identified by LBAs 48 through 55 are at VLBA 6 and so on.

Figure 1:
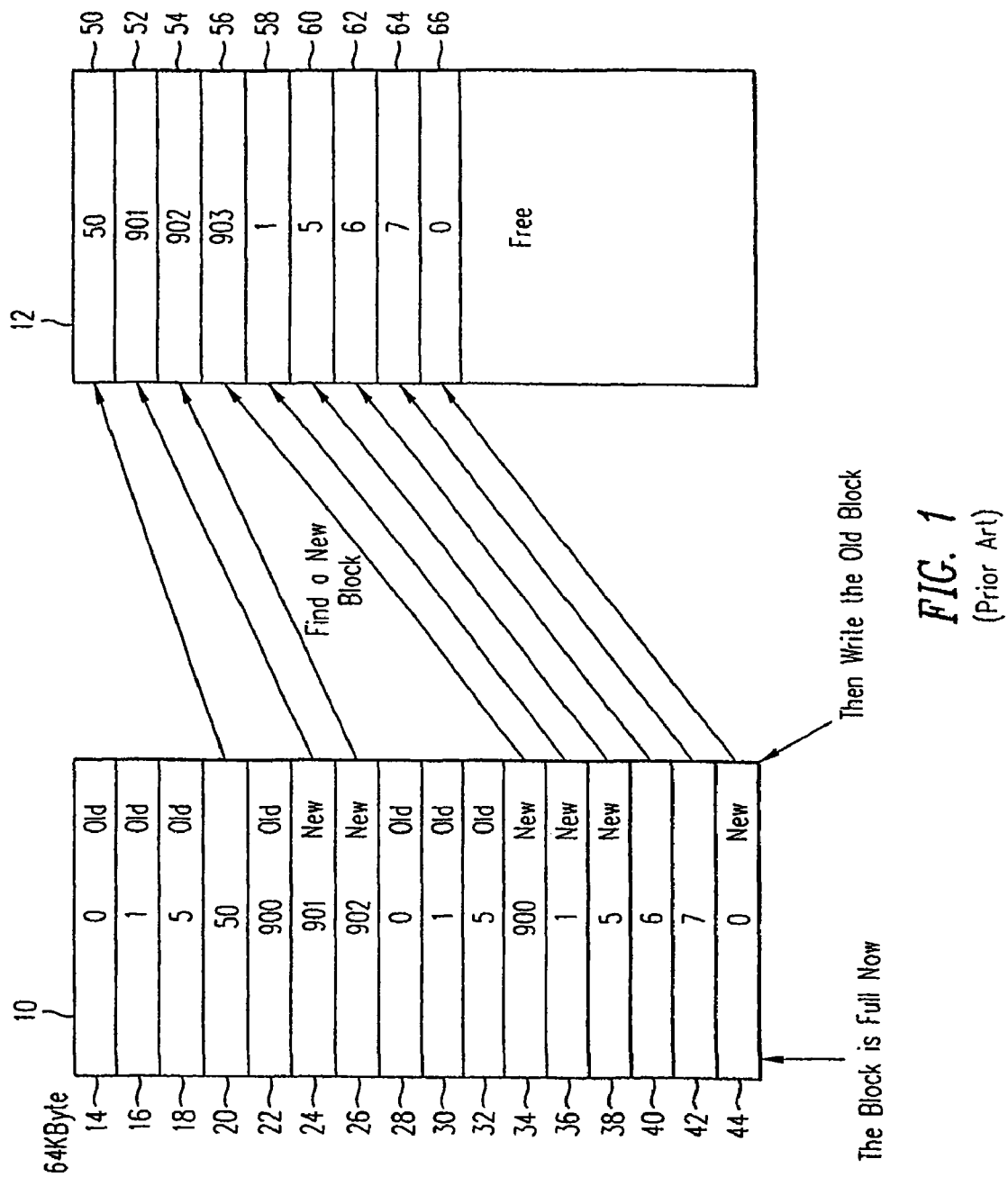
FIG. 1 shows an example of a prior art technique for moving sector information upon rewrite or updating operations.
Figure 1A:
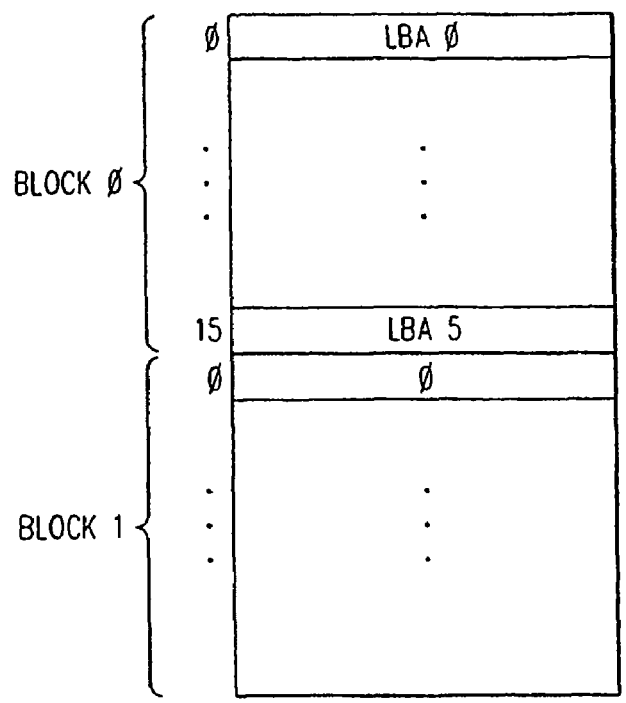
FIG. 1(a) shows another example of a prior art technique for moving sector information upon re-write or updating operations.
Figure 1B:
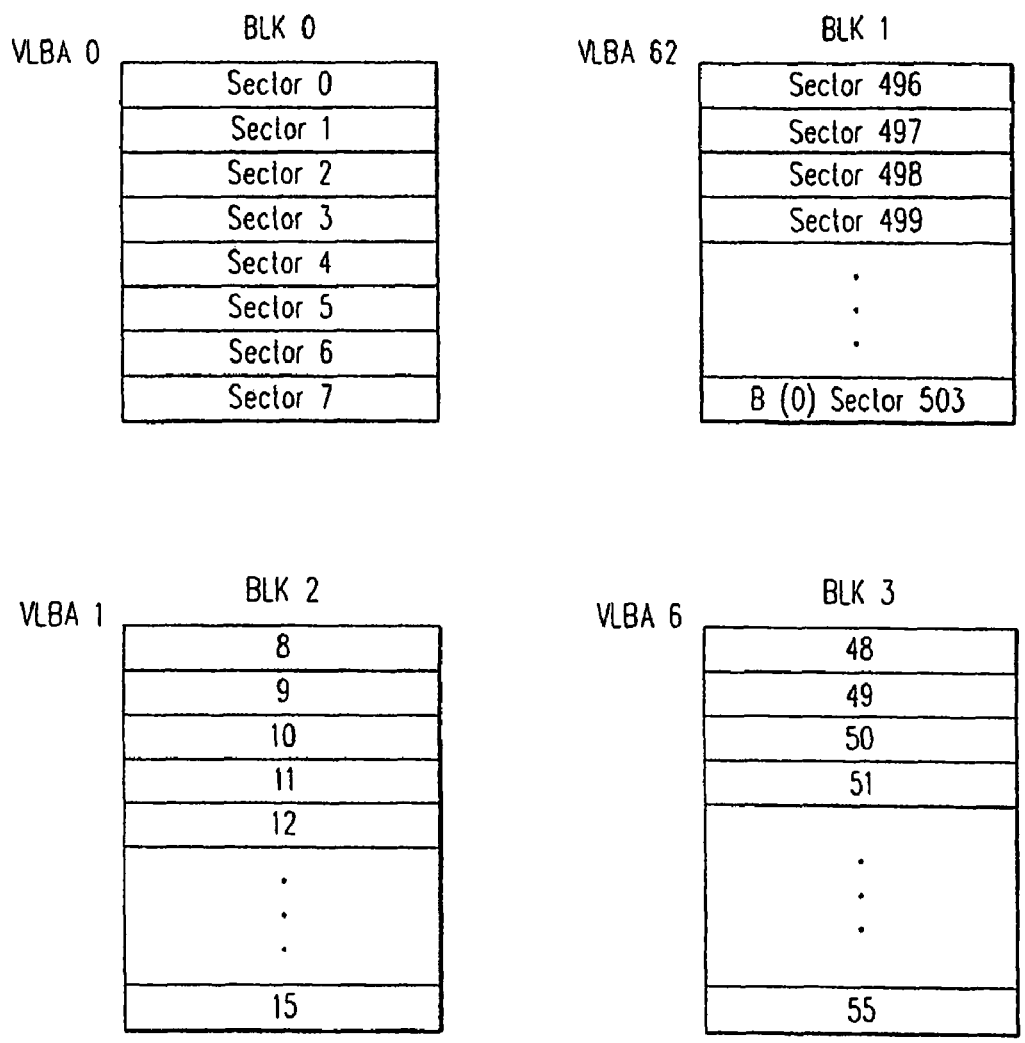
FIG. 1(b) shows yet another example of a prior art technique for moving sector information upon re-write or updating operations.

During 'clean-up', the sectors of FIG. 2 having current sector information (not 'old' information) are re-arranged into sequential order and placed within the blocks 3 of FIG. 3. Starting with sector 0, the sector identified by LBA 0, is moved from 117 (in FIG. 2) to 202 in FIG. 3. That is, the current sector 0 information, which now resides in Block N+M rather than Block N, is moved to the first location of Block 4, at 202. The sector that is in the next sequential order, i.e. sector 1, is found in the blocks 100 of FIG. 2, at 118 and moved to 204 in FIG. 3 (whenever reference is made throughout this document to moving a sector, the information within the sector or sector information is what is physically moved). Sector 2 is found at 120 in Block N+M in FIG. 2 and moved to 206 in FIG. 3 and sector 3 is found at 122 in FIG. 2 and moved to 208 in FIG. 3. The next sequentially-ordered sector, sector 4 is found in Block 0 (shown in FIG. 1(b)) and moved to 210 in FIG. 3 and the following 3 sectors follow at 212, 214 and 216 in FIG. 3.

The following eight sectors are sequentially placed within the block identified by VLBA 1 in FIG. 3. Each of these sectors is also found from various temporary block locations within blocks 100 in FIG. 2 and moved to the locations 218-232, respectively. That is, sectors 8 and 9 are found in Block 2 (shown in FIG. 1 (b)) and moved to 218 and 220, respectively. Sectors 10-11 are found at 104 and 106, respectively in Block N of FIG. 2 and remaining sectors 12-15 are found in Block 2 (shown in FIG. 1 (b)) and placed at 226-232, respectively.

In FIG. 3, VLBA 62 is shown to include information for sectors 496-503 with sectors 496-498 being moved from Block N+M at 124-130 of FIG. 2, respectively, to 250-254 of VLBA 62 of FIG. 3, respectively and sectors 499-503 being moved from Block 1, not shown in FIG. 2, to 256-264 in FIG. 3, respectively. Without going through the details, in a similar fashion, VLBA 6 of FIG. 3 is updated to include sectors 48-55 from temporary blocks 100.

Figure 4:
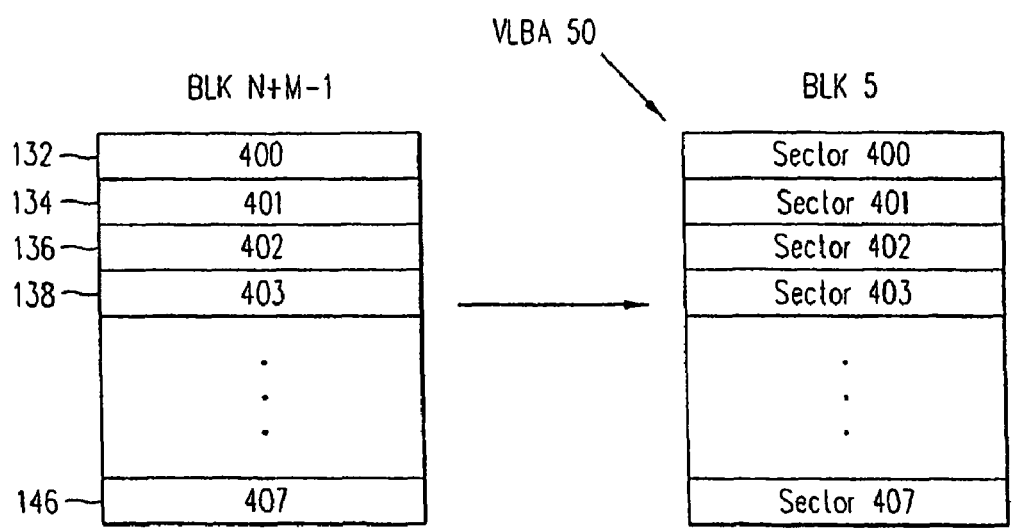
FIG. 4 further expands on the example of FIG. 2.

Referring back to FIG. 2, Block N+M−1 includes sectors that are already in sequential order, as noted above, since the host wrote them in sequential order. Accordingly, there is no need to move these sectors into another block for the purpose of reorganizing them into sequential order. Rather, Block N+M−1 is renumbered as VLBA Block 50 (this is due to sectors 400 as divided into 8 being 50) and taken out of temporary blocks 100 and considered among the blocks 200 of FIG. 3. Thus as shown in FIG. 4, no moves are required for sectors 400-408 saving a number of operations that substantially increases the system performance. In fact, the more the number of sequential writes of at least a number of sectors equal to the number of sectors within a block, the greater the system performance due to a lesser number of move operations.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method comprising:

writing or storing information associated with a particular logical block address (LBA) in a sector location of a first group of blocks of memory, the first group of blocks of memory comprising at least one block of memory and the information comprising sector information; and rewriting or updating the information associated with the particular LBA in a free or available sector location of the first group of blocks of memory, wherein rewriting or updating the information associated with the particular LBA comprises:

writing or storing rewritten or updated sector information in the free or available sector location of the first group of blocks of memory;

identifying the rewritten or updated sector information as being current or new;

identifying the sector information associated with the particular LBA that had been previously written or stored as old; and writing or storing sector information written or stored in the first group of blocks of memory and identified as current or new, including the rewritten or updated sector information, in sector locations of a second group of blocks of memory in accordance with a sequential order of respective LBAs associated with the sector information written or stored in the first group of blocks of memory and identified as current or new, wherein the second group of blocks comprise at least one block of memory and each block of the second group of blocks is associated with a respective virtual logical block address (VLBA).

2. The method of claim 1, wherein a particular VLBA of a particular block of the second group of blocks of memory is a function of the particular LBAs associated with the sector information written or stored in the particular block.

3. A method, comprising:
  writing or storing information associated with a particular logical block address (LBA), wherein writing or storing information comprises writing or storing sector information in a sector location of a first block;
  rewriting or updating the information associated with the LBA, wherein rewriting or updating the information associated with the particular LBA comprises writing or storing rewritten or updated sector information in a sector location of a second block; and
  writing or storing the rewritten or updated sector information in a sector location of a third block, wherein the sector location of the third block corresponds to a location of the particular LBA in a sequence of LBAs that are associated with information written or stored in the third block wherein the third block is associated with a particular virtual logical block address (VLBA), and wherein the particular VLBA of the third block is a function of the LBAs that are associated with the information written or stored in the third block.

4. The method of claim 3, wherein the sector location of the first block is associated with a respective physical block address (PBA).

5. A controller configured to:
  write or store information associated with a particular logical block address (LBA) in a sector location of a first block of memory communicatively coupled to the controller;
  rewrite or update the information associated with the particular LBA in a sector location of a second block of the memory, wherein the controller being configured to rewrite or update the information associated with the particular LBA comprises the controller being configured to write or store rewritten or updated sector information in the sector location of the second block of the memory; and
  write or store the rewritten or updated sector information in a sector location of a third block of the memory, wherein the sector location of the third block corresponds to a location of the particular LBA in a sequence of LBAs that are associated with information written or stored in the third block wherein the third block is associated with a particular virtual logical block address (VLBA), and wherein the particular VLBA of the third block is a function of the LBAs that are associated with the information written or stored in the third block.

6. A memory system comprising:
  memory organized into blocks, wherein each block comprises a plurality of sector locations, wherein each of the sector locations is configured to store sector information; and
  a controller configured to:
    write or store information associated with a particular logical block address (LBA) in a sector location of a first block of the memory;
    rewrite or update the information associated with the particular LBA in a sector location of a second block of the memory, wherein the controller being configured to rewrite or update the information associated with the particular LBA comprises the controller being configured to write or store rewritten or updated sector information in the sector location of the second block of the memory; and
    write or store the rewritten or updated sector information in a sector location of a third block of the memory, wherein the sector location of the third block corresponds to a location of the particular LBA in a sequence of LBAs that are associated with information written or stored in the third block wherein the third block is associated with a particular virtual logical block address (VLBA), and wherein the particular VLBA of the third block is a function of the LBAs that are associated with the information written or stored in the third block.

7. A controller configured to:
  write or store information identified by a particular logical block address (LBA) in a sector location of a first group of blocks of memory communicatively coupled to the controller, the first group of blocks of memory comprising at least one block of memory and the information comprising sector information; and
  rewrite or update the information associated with the particular LBA in a free or available sector location of the first group of blocks of memory, wherein the controller being configured to rewrite or update the information associated with the particular LBA comprises the controller being configured to:
    write or store rewritten or updated sector information in the free or available sector location of the first group of blocks of memory;
    identify the rewritten or updated sector information as being current or new;
    identify the sector information associated with the particular LBA that had been previously written or stored as old; and
    write or store sector information written or stored in the first group of blocks of memory and identified as current or new in sector locations of a second group of blocks of memory in accordance with a sequential order of respective LBAs associated with the sector information written or stored in the first group of blocks of memory and identified as current or new, wherein the second group of blocks of memory comprise at least one block of memory and each of the second group of blocks is associated with a respective virtual logical block address (VLBA).

8. The controller of claim 7, wherein the controller being configured to identify the rewritten or updated sector information as being current or new comprises the controller being configured to designate the rewritten or updated sector information as being current or new.

9. The controller of claim 7, wherein the controller is configured to write or store sector information written or stored in the first group of blocks of memory and identified as current or new in sector locations of a second group of blocks responsive to the first group of blocks being substantially filled with sector information.

10. The controller of claim 7, wherein the controller is configured to write or store sector information written or stored in the first group of blocks of memory and identified as current or new in sector locations of a second group of blocks when the first group of blocks are filled with sector information.

11. The controller of claim 7, wherein the second group of blocks of memory comprises blocks other than blocks included in the first group of blocks of memory.

12. The controller of claim 7, wherein the controller is further configured to:
  associate a particular block of the first group of blocks of memory with a particular virtual logical block address (VLBA) if all of the sector information written or stored in the particular block is identified as current or new and is written or stored in accordance with a sequential ordering of the LBAs associated with the sector information written or stored in the particular block; and not write or store the sector information written or stored in the particular block of memory of the first group of blocks and identified as current or new in sector locations of the second group of blocks.

13. The controller of claim 7, wherein the second group of blocks comprise a group of free blocks found by the controller.

14. The controller of claim 7, wherein the particular VLBA of a particular block of the second group of blocks is a function of the particular LBAs associated with the sector information written or stored in the particular block.

15. The controller of claim 7, wherein the controller is configured to associate the respective VLBAs with the respective blocks of the second group of blocks.

16. A memory system comprising:

memory organized into blocks, wherein each block comprises a plurality of sector locations, wherein each of the sector locations is configured to store sector information; and a controller configured to:

write or store information identified by a particular logical block address (LBA) in a sector location of a first group of blocks of the memory, the first group of blocks of memory comprising at least one block of memory and the information comprising sector information;

rewrite or update the information associated with the particular LBA in a free or available sector location of the first group of blocks of memory, wherein the controller being configured to rewrite or update the information associated with the particular LBA comprises the controller being configured to:

write or store rewritten or updated sector information in the free or available sector location of the first group of blocks of memory;

identify the rewritten or updated sector information as being current or new;

identify the sector information associated with the particular LBA that had been previously written or stored as old; and write or store sector information written or stored in the first group of blocks of memory and identified as current or new in sector locations of a second group of blocks of the memory in accordance with a sequential order of respective LBAs associated with the sector information written or stored in the first group of blocks of memory and identified as current or new, wherein the second group of blocks of memory comprise at least one block of memory and further wherein the controller is further configured to associate a respective virtual logical block address (VLBA) with each of the blocks of the second group of blocks.

* * * * *

UNITED STATES PATENT AND TRADEMARK OFFICE
CERTIFICATE OF CORRECTION

PATENT NO.         : 8,019,932 B2                                  Page 1 of 1
APPLICATION NO.    : 12/773187
DATED              : September 13, 2011
INVENTOR(S)        : Petro Estakhri It is certified that error appears in the above-identified patent and that said Letters Patent is hereby corrected as shown below:

On the face page, in field (74), in "Attorney, Agent, or Firm", in column 2, line 1, delete "Poglaze," and insert -- Polglaze, --, therefor.

Signed and Sealed this
Eighth Day of November, 2011

David J. Kappos
*Director of the United States Patent and Trademark Office*